US010305435B1

(12) United States Patent
Murugesu et al.

(10) Patent No.: US 10,305,435 B1
(45) Date of Patent: May 28, 2019

(54) TRANSCEIVERS AND SYSTEMS HAVING DIGITAL DISTORTION COMPENSATION AND METHODS THEREOF

(71) Applicant: Nokia Solutions and Networks Oy, Espoo (FI)

(72) Inventors: Rosanah Murugesu, Murray Hill, NJ (US); Hungkei Chow, Murray Hill, NJ (US); Werner Coomans, Antwerp (BE)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 0 days.

(21) Appl. No.: 15/970,438

(22) Filed: May 3, 2018

(51) Int. Cl.
*H03F 1/32* (2006.01)
*H03F 3/189* (2006.01)
*H03M 1/00* (2006.01)
*H03F 3/68* (2006.01)

(52) U.S. Cl.
CPC ........... *H03F 1/3258* (2013.01); *H03F 3/189* (2013.01); *H03M 1/001* (2013.01); *H03F 3/68* (2013.01)

(58) Field of Classification Search
CPC .... H03F 1/3258; H03F 1/3247; H03F 1/3241; H03F 2200/451; H03F 3/195
See application file for complete search history.

(56) References Cited

U.S. PATENT DOCUMENTS

| | | | | |
|---|---|---|---|---|
| 6,054,894 A * | 4/2000 | Wright | ................... | H03F 1/0294 330/124 R |
| 2004/0219889 A1* | 11/2004 | Honcharenko | ...... | H04B 1/0483 455/91 |
| 2011/0051785 A1* | 3/2011 | Kenington | ............ | H03F 1/3247 375/219 |
| 2011/0149714 A1* | 6/2011 | Rimini | ................... | H04B 1/525 370/201 |
| 2017/0104502 A1 | 4/2017 | Pratt | | |

OTHER PUBLICATIONS

Chung et al. (IEEE, A 73. 1dB SNDR Digitally Assisted Subsampler for RF Power Amplifier Linearization Systems, 2009, pertinent pp. 148-149).*
DOCSIS 3.1 Physical Layer Specification Version I13 (published Dec. 20, 2017).

* cited by examiner

*Primary Examiner* — Kabir A Timory
(74) *Attorney, Agent, or Firm* — Harness, Dickey & Pierce, P.L.C.

(57) ABSTRACT

In an example embodiment, a transceiver includes a plurality of amplifiers configured to amplify an analog transmit signal to generate a plurality of amplified transmit signals for further transmission, a combiner configured to combine a plurality of output signals to generate a combined signal, the plurality of output signals being based on the plurality of amplified transmit signals and at least one processor configured to execute computer-readable instructions to cause the transceiver to determine pre-distortion compensation coefficients based on the combined signal and generate a pre-distortion compensated transmit signal based on the pre-distortion compensation coefficients.

17 Claims, 8 Drawing Sheets

TRANSCEIVERS AND SYSTEMS HAVING DIGITAL DISTORTION COMPENSATION AND METHODS THEREOF

BACKGROUND

In wireless and wireline communication systems, a power amplifier (PA) is often included in a transmitter to amplify an output signal.

To improve power efficiency, the PA often operates near its saturation region. At the saturation region, most PA's exhibit nonlinear characteristics. PA nonlinearity also gives rise to several forms of distortion, such as harmonic distortion, spectral regrowth and intermodulation distortion. Combining with typical high peak-to-average-power modulation schemes (like Orthogonal Frequency Division Multiplexing), nonlinear distortion is a factor in the overall system design of wireless and wireline communication systems.

SUMMARY

In at least one example embodiment, a transceiver includes a plurality of amplifiers configured to amplify an analog transmit signal to generate a plurality of amplified transmit signals for further transmission, a combiner configured to combine a plurality of output signals to generate a combined signal, the plurality of output signals being based on the plurality of amplified transmit signals and at least one processor configured to execute computer-readable instructions to cause the transceiver to determine pre-distortion compensation coefficients based on the combined signal and generate a pre-distortion compensated transmit signal based on the pre-distortion compensation coefficients.

In at least one example embodiment, the combiner is an analog combiner, the combined signal is an analog signal, and the transceiver further includes an analog-to-digital converter (ADC) configured to convert the combined signal to a digital combined signal.

In at least one example embodiment, the combiner is a digital combiner and the combined signal is a digital combined signal.

In at least one example embodiment, the at least one processor is configured to execute the computer-readable instructions to cause the transceiver to determine an error based on the digital combined signal and a reference signal and determine the pre-distortion compensation coefficients based on the error.

In at least one example embodiment, the reference signal is a digital transmit signal, the analog transmit signal is based on the digital transmit signal and the at least one processor is configured to execute the computer-readable instructions to cause the transceiver to determine the error as being a difference between the digital combined signal and a convolution of the reference signal with a channel response within the transceiver.

In at least one example embodiment, the reference signal is a digital transmit signal, the analog transmit signal is based on the digital transmit signal and the at least one processor is configured to execute the computer-readable instructions to cause the transceiver to determine the error as being a difference between the reference signal and a convolution of the digital combined signal with an inverse of a channel response within the transceiver.

In at least one example embodiment, the at least one processor is configured to execute the computer-readable instructions to cause the transceiver to determine the channel response within the transceiver In at least one example embodiment, the channel response is a response of a monitor channel including at least one of the power amplifiers and the combiner.

In at least one example embodiment, the monitor channel further includes a pre-equalization filter.

In at least one example embodiment, the at least one processor is configured to execute the computer-readable instructions to cause the transceiver to determine an average signal-to-noise and distortion ratio (SNDR) for each of the plurality of amplifiers using a multi-tone signal and adjust a bias of each of the plurality of amplifiers based on the average SNDRs.

In at least one example embodiment, the at least one processor is configured to execute the computer-readable instructions to cause the transceiver to iteratively update the pre-distortion compensation coefficients using a least mean squares algorithm.

In at least one example embodiment, the transceiver is a full-duplex transceiver.

In at least one example embodiment, the at least one processor is configured to execute the computer-readable instructions to cause the transceiver to determine the pre-distortion compensation coefficients to pre-compensate for inter-modulation distortions and harmonic distortions caused by the plurality of amplifiers using a complex baseband digital pre-distortion (DPD) method.

At least one example embodiment provides a method for compensating for digital distortion. The method includes amplifying an analog transmit signal to generate a plurality of amplified transmit signals for further transmission, combining a plurality of output signals to generate a combined signal, the plurality of output signals being based on the plurality of amplified transmit signals, determining pre-distortion compensation coefficients based on the combined signal and generating a subsequent pre-distortion compensated transmit signal based on the pre-distortion compensation coefficients.

In at least one example embodiment, the combining combines a plurality of analog output signals, the combined signal is an analog signal and the method further includes converting the combined signal to a digital combined signal.

In at least one example embodiment, the combining combines a plurality of digital output signals and the combined signal is a digital combined signal.

In at least one example embodiment, the method further includes determining an error based on the digital combined signal and a reference signal and determining the pre-distortion compensation coefficients based on the error.

In at least one example embodiment, the reference signal is a digital transmit signal, the analog transmit signal is based on the digital transmit signal and the determining the error determines the error as being a difference between the digital combined signal and a convolution of the reference signal with a channel response within a transceiver.

In at least one example embodiment, the reference signal is a digital transmit signal, the analog transmit signal is based on the digital transmit signal and the determining the error determines the error as being a difference between the reference signal and a convolution of the digital combined signal with an inverse of a channel response within a transceiver.

In at least one example embodiment, the method further includes determining the channel response within a transceiver.

In at least one example embodiment, the channel response is a response of a monitor channel including at least one power amplifier and a combiner.

In at least one example embodiment, the monitor channel further includes a pre-equalization filter.

In at least one example embodiment, the method further includes determining an average signal-to-noise and distortion ratio (SNDR) for each of a plurality of amplifiers using a multi-tone signal and adjusting a bias of each of the plurality of amplifiers based on the average SNDRs.

In at least one example embodiment, the method further includes iteratively updating the pre-distortion compensation coefficients using a least mean squares algorithm.

In at least one example embodiment, the determining determines the pre-distortion compensation coefficients to pre-compensate for inter-modulation distortions and harmonic distortions caused by the plurality of amplifiers using a complex baseband digital pre-distortion (DPD) method.

At least one example embodiment provides a transceiver including a means for amplifying an analog transmit signal to generate a plurality of amplified transmit signals for further transmission, a means for combining a plurality of output signals to generate a combined signal, the plurality of output signals being based on the plurality of amplified transmit signals a means for determining pre-distortion compensation coefficients based on the combined signal and a means for generating a subsequent pre-distortion compensated transmit signal based on the pre-distortion compensation coefficients.

In at least one example embodiment, the means for combining combines a plurality of analog output signals, the combined signal is an analog signal and the system further includes a means for converting the combined signal to a digital combined signal.

In at least one example embodiment, the means for combining combines a plurality of digital output signals and the combined signal is a digital combined signal.

In at least one example embodiment, the transceiver further includes means for determining an error based on the digital combined signal and a reference signal and means for determining the pre-distortion compensation coefficients based on the error.

In at least one example embodiment, the reference signal is a digital transmit signal, the analog transmit signal is based on the digital transmit signal and the means for determining the error determines the error as being a difference between the digital combined signal and a convolution of the reference signal with a channel response within the transceiver.

In at least one example embodiment, the reference signal is a digital transmit signal, the analog transmit signal is based on the digital transmit signal and the means for determining the error determines the error as being a difference between the reference signal and a convolution of the digital combined signal with an inverse of a channel response within the transceiver.

In at least one example embodiment, the transceiver further includes a means for determining the channel response within a transceiver.

In at least one example embodiment, the channel response is a response of a monitor channel including the means for amplifying and the means for combining.

In at least one example embodiment, the monitor channel further includes a means for pre-equalizing.

In at least one example embodiment, the transceiver further includes a means for determining an average signal-to-noise and distortion ratio (SNDR) for each of a plurality of amplifiers using a multi-tone signal and a means for adjusting a bias of each of the plurality of amplifiers based on the average SNDRs.

In at least one example embodiment, the transceiver further includes a means for iteratively updating the pre-distortion compensation coefficients using a least mean squares algorithm.

In at least one example embodiment, the means for determining the pre-distortion compensation coefficients determines the pre-distortion compensation coefficients to pre-compensate for inter-modulation distortions and harmonic distortions caused by the plurality of amplifiers using a complex baseband digital pre-distortion (DPD) method.

BRIEF DESCRIPTION OF THE DRAWINGS

Example embodiments will be more clearly understood from the following detailed description taken in conjunction with the accompanying drawings. FIGS. 1-6 represent non-limiting, example embodiments as described herein.

FIG. 1 illustrates a conventional transceiver having closed-loop digital pre-distortion compensation;

FIG. 3 illustrates an example embodiment of a DPD module illustrated in FIGS. 2A-2B;

FIG. 5 illustrates a method of generating a pre-distortion compensated transmit signal according to an example embodiment; and FIG. 6 illustrates a communication system according to an example embodiment.

DETAILED DESCRIPTION

Figure 1:
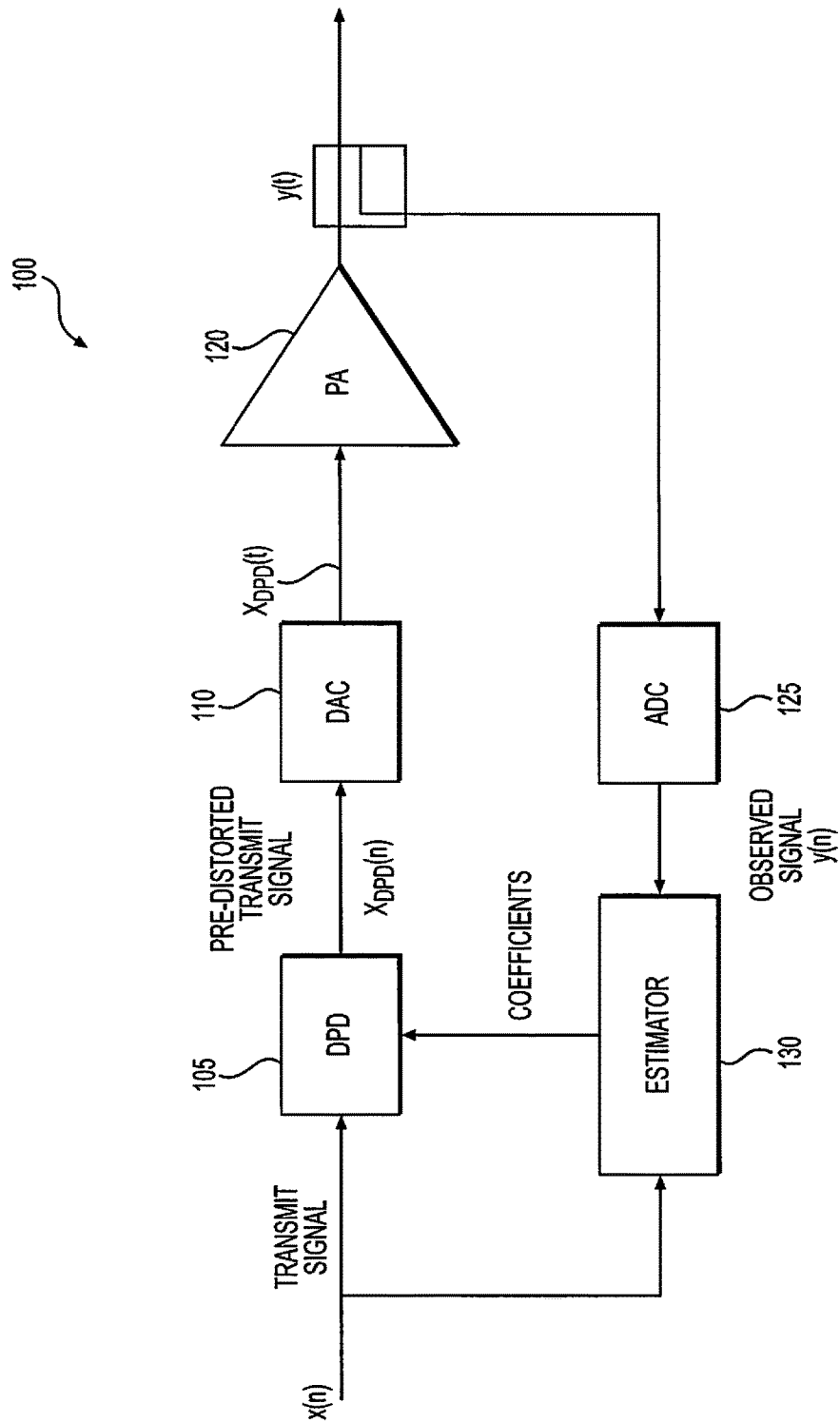

Various example embodiments will now be described more fully with reference to the accompanying drawings in which some example embodiments are illustrated.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the claims. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of example embodiments and corresponding detailed description are presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments will be described with reference to acts and symbolic representations of operations (e.g., in the form of flowcharts) that may be implemented as program modules or functional processes including routines, programs, objects, components, data structures, etc., that perform particular tasks or implement particular abstract data types and may be implemented using existing hardware at existing network elements or control nodes. Such existing hardware may include one or more Central Processing Units (CPUs), digital signal processors (DSPs), application-specific-integrated-circuits, field programmable gate arrays (FPGAs) computers, system-on-chip (SoC) or the like.

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of example embodiments are typically encoded on some form of tangible (or recording) storage medium. The tangible storage medium may be magnetic (e.g., a floppy disk or a hard drive), optical (e.g., a compact disk read only memory, or "CD ROM"), and may be read-only memory (ROM), random access memory (RAM), flash memory (e.g., USB flash drives, memory cards, memory sticks, etc.), for example. The terms "tangible storage medium" and "memory" may be used interchangeably. Example embodiments are not limited by these aspects of any given implementation.

As stated above, power amplifiers in wireless and wireline communication systems operate near a saturation region. In the saturation region, the power amplifier exhibits nonlinear characteristics. Digital pre-distortion (DPD) is a technique used to linearize the nonlinear response of a power amplifier (PA) over its intended power and signaling range. DPD uses digital signal processing techniques to pre-distort a transmit signal before amplification by the PA. As a result, the cascade of the DPD response and the PA response produces the desired linear response.

In adaptive DPD, a digital pre-distorter changes the modulated signal to counter the nonlinear effect introduced by the PA, before the signal is converted into analog format using a digital-to-analog converter (DAC). The pre-compensated analog signal is then amplified by a PA. The PA output is sampled and converted into digital format using analog-to-digital converters (ADCs) for distortion estimation. A DPD estimator compares the original transmit digital signal with the digital observed signal in order to adapt the pre-distorter characteristic to compensate for the nonlinearities introduced by the PA.

FIG. 1 illustrates a conventional transceiver having closed-loop digital pre-distortion compensation. Adaptive digital pre-distortion (DPD) technique is a method to compensate for nonlinear distortion. In adaptive DPD, a digital pre-distorter 105 changes a modulated signal x(n) to counter the nonlinear effect and generates a pre-distortion compensated transmit signal $x_{DPD}(n)$. The pre-distortion compensated transmit signal $x_{DPD}(n)$ is converted into an analog signal $x_{DPD}(t)$ using a digital-to-analog converter (DAC) 110. The analog signal $x_{DPD}(t)$ is then amplified by a PA 120. The PA 120 output is sampled and converted into a digital signal y(n) using an analog-to-digital converter (ADC) 125. A DPD estimator 130 compares the original transmit digital signal x(k) with the observed signal y(n) in order to adapt the pre-distorter 105 to compensate for the nonlinearities introduced by the output of the PA 120.

Conventional DPD techniques in wireless applications are applied to signals that are centered at frequencies in the GHz range and signaling bandwidth up to several MHz. Data Over Cable Service (DOCSIS) operation involves transmission channel frequencies in the 108 MHz to 1218 MHz range. The bandwidths are larger and the center frequencies are much smaller than the bandwidths and center frequencies usually encountered in DPD systems. The difference in frequency range leads to both harmonic distortion and intermodulation distortion within the signal bandwidth.

DOCSIS specifications often require an analog upward tilt equalization before the nonlinear PA. This tilt equalization can be as high as −21 dB gain at 108 MHz and 0 dB gain at 1218 MHz.

In a DOCSIS Cable Modem Termination System (CMTS) that supports multiple RF output ports, there is one or multiple DACs driving multiple PAs with the same signal at the same high power level. Due to part-to-part variation, the distortion performance varies among different PAs operating at the same high power level and frequencies.

At least some example embodiments provide baseband DPD models to account for harmonic distortion and to cope with wide transmission bandwidth. Moreover, at least some example embodiments provide transceivers and systems to compensate for distortion generated by a tilt equalizer (or any linear time-invariant (LTI) filter) followed by a nonlinear PA and correct for nonlinearities caused by multiple PAs using a single DPD block in a multi-port system.

Example embodiments are applicable to both conventional DOCSIS and full-duplex (FDX) DOCSIS systems. At least some example embodiments disclose a method to determine nonlinear coefficients of a baseband DPD block by measuring a lower power first order channel response between a DAC in a transmit path and a DPD ADC.

In addition, at least some example embodiments disclose a method to track and update distortion compensation coefficients without service interruption by combining outputs of individual PAs using an analog combiner and observing the combined signal using a single ADC.

In other example embodiments, a digital combiner may be used to combine signals from analog-to-digital converters (ADCs) used for echo cancellation. Alternatively, multiple DPD ADCs (not used for echo cancellation) may be used to combine observed signals.

By combining the outputs of the individual PAs, any transients in analog transfer functions introduced by a switching action (which may affect equalization and impact echo cancellation) are reduced and/or avoided.

Using a combiner observation makes the DPD algorithm converge to a simultaneous "average" optimization of the individual PAs, without requiring explicit weighting or similar features that would further complicate the DPD training.

Figure 2A:
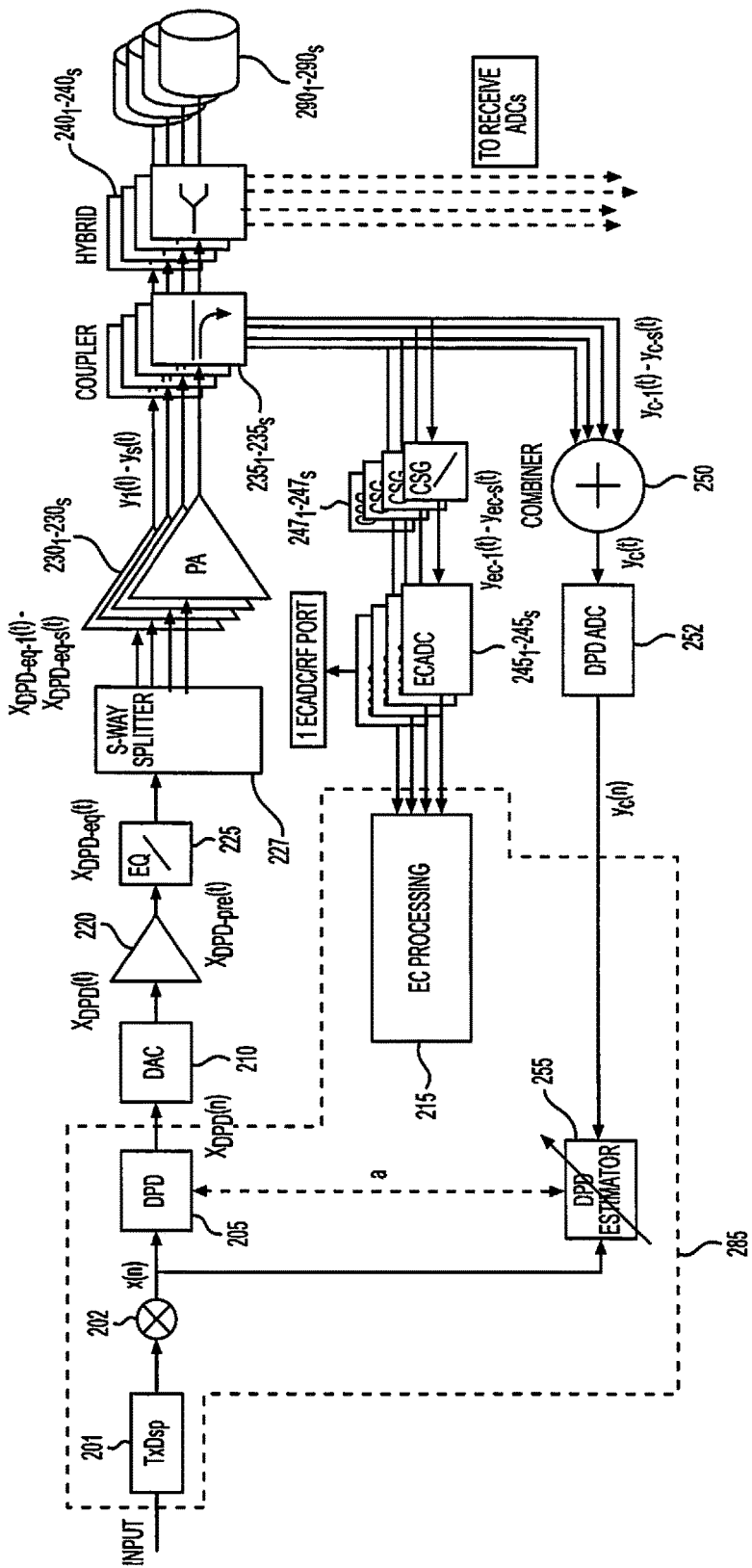
FIG. 2A illustrates a transceiver having digital pre-distortion compensation according to an example embodiment.

FIG. 2A illustrates a transceiver having digital pre-distortion compensation according to an example embodiment.

As shown, a transceiver 200 may be a full-duplex DOCSIS Cable Modem Termination System (CMTS) that supports multiple RF output ports. The input data may be data that has been modulated using orthogonal frequency division multiplexing (OFDM). The transceiver 200 includes a transmission path digital signal processor (TxDSP) 201, a digital up-converter 202, DPD module 205, a first DAC 210, an echo cancellation (EC) processor 215, a pre-amplifier 220, a pre-equalizer 225, an s-way splitter 227, s power amplifiers $230_1$-$230_s$, s couplers $235_1$-$235_s$, s hybrid front-ends $240_1$-$240_s$ connectable to s cable transmission lines $290_1$-$290_s$, s echo cancelling ADCs (ECADCs) $245_1$-$245_s$, a combiner 250, a DPD ADC 252 and a distortion estimator 255. While not illustrated, there may also be a digital up-converter between the DPD module 205 and the first DAC 210. Moreover, in one example embodiment, filters $247_1$-$247_s$ may be between the echo cancelling ADCs (ECADCs) $245_1$-$245_s$ and the couplers $235_1$-$235_s$, respectively.

A processing system 285 includes the TxDSP 201, the digital up-converter 202, the DPD module 205, the EC processor 215 and the distortion estimator 255.

The processing system 285 may be implemented in hardware, at least one processor configured to execute software, firmware, or any combination thereof, for example. When the processing system 285 is hardware, such existing hardware may include one or more Central Processing Units (CPUs), digital signal processors (DSPs), application-specific-integrated-circuits (ASICs), field programmable gate arrays (FPGAs) computers or the like configured as special purpose machines to perform the functions of the TxDSP 201, the digital up-converter 202, the DPD module 205, the EC processor 215 and the distortion estimator 255. CPUs, DSPs, ASICs and FPGAs may generally be referred to as processing devices.

In the event where the processing system 285 is a processor executing software, the processor is configured as a special purpose machine to execute the software, stored in a storage medium (e.g., a memory 625), to perform the functions of the TxDSP 201, the digital up-converter 202, the DPD module 205, the EC processor 215 and the distortion estimator 255. In such an embodiment, the processor may include one or more Central Processing Units (CPUs), digital signal processors (DSPs), application-specific-integrated-circuits (ASICs), field programmable gate arrays (FPGAs) computers.

A transmit processing path may include the TxDSP 201, the digital up-converter 202, the DPD module 205, the DAC 210, the pre-amplifier 220, the pre-equalizer 225, the PAs $230_1$-$230_s$, the couplers $235_1$-$235_s$ and the hybrid front-ends $240_1$-$240_s$.

The TxDSP 201, which may be implemented in hardware or a processor executing software, implements a single channel or multiple channels transmitter function. For example, the TxDSP 201 may implement an orthogonal frequency-division multiplexing (OFDM) modulator that generates one or multiple channels of transmitting a baseband signal.

The first digital up-converter 202 converts the output of the TxDSP 201 to generate a multi-channel wideband digital transmit signal x(n). The adaptive DPD module 205 filters the digital transmit signal x(n) based on pre-distortion compensation coefficients $\bar{a}$ from the distortion estimator 255 and generates a pre-distortion compensated transmit signal $x_{DPD}(n)$. The DAC 210 converts the pre-distortion compensated transmit signal $x_{DPD}(n)$ to an analog pre-distortion compensated transmit signal $x_{DPD}(t)$.

The analog pre-distortion compensated transmit signal $x_{DPD}(t)$ is then amplified by the pre-amplifier 220 to generate the pre-amplified signals $x_{DPD-pre}(t)$ and then equalized by the pre-equalizer 225 to generate an analog equalized signal $x_{DPD-eq}(t)$. The analog equalized signal $x_{DPD-eq}(t)$ may also be referred to as an analog transmit signal. The pre-equalizer 225 outputs the analog equalized signal $x_{DPD-eq}(t)$, which is an equalized output of the pre-amplifier 220. The pre-equalizer 225 may be an upward-tilt pre-equalization filter that accounts for a downward slope of the cable transmission lines $290_1$-$290_s$.

The analog transmit signal $x_{DPD-eq}(t)$ is split by the s-way splitter 227 into s transmit signals for further transmission $x_{DPD-eq-1}(t)$-$x_{DPD-eq-s}(t)$ (where s is an integer greater than one) and those signals are amplified by the PAs $230_1$-$230_s$, respectively, to generate a plurality of amplified transmit signals for further transmission $y_1(t)$-$y_s(t)$. The amplified transmit signals for further transmission $y_1(t)$-$y_s(t)$ are transmitted by the hybrid front-ends $240_1$-$240_s$ over the cable lines $290_1$-$290_s$. The hybrid front-ends $240_1$-$240_s$ are wire hybrid circuits that couple the transmitters and the receivers to the external cable lines $290_1$-$290_s$, respectively. The hybrid front-ends $240_1$-$240_s$ perform an initial directional separation between the transmitter and the receiver signals, while coupling the received far-end signal from the external cable lines $290_1$-$290_s$ to receive processing paths, respectively. The receive processing paths of the transceiver 200 that may include a low-noise amplifier, an ADC and a digital down-converter.

Furthermore, the couplers $235_1$-$235_s$ send a plurality of output signals $y_{c-1}(t)$-$y_{c-s}(t)$ to the combiner 250, which combines the output signals output signals $y_{c-1}(t)$-$y_{c-s}(t)$ to generate a combined analog signal $y_c(t)$. The plurality of output signals $y_{c-1}(t)$-$y_{c-s}(t)$ are the amplified transmit signals for further transmission $y_1(t)$-$y_s(t)$ with any changes caused by the couplers $235_1$-$235_s$ and any intermediary filters.

The DPD ADC 252 converts the combined analog signal $y_c(t)$ to a digital combined signal $y_c(n)$. While the embodiment illustrated in FIG. 2A illustrates the combiner 250 as an s:1 combiner, it should be understood that any combination of combiners that consolidate n signals to 1 may be used.

The distortion estimator 255 determines the pre-distortion compensation coefficients $\vec{a}$. based on the observed digital combined signal $y_c(n)$ and the digital transmit signal $x(n)$ taken as a reference as will be further described.

The transceiver 200 may be initially calibrated by using a multi-tone signal across the transmit processing path, observing a corresponding amplified multi-tone signal at the DPD ADC 252 and measuring the signal-to-noise plus distortion ratio (SNDR) of each PA $230_1$-$230_s$. More specifically, the PAs $230_1$-$230_s$ are all initially set to a nominal bias value (e.g., 420 mA). Then one PA is enabled and the other PAs are disabled. A multi-tone (two or more) signal is transmitted and the SNDR of the enabled PA is measured. The process is repeated for the other PAs. The average of the measured SNDRs is a target SNDR.

Then, one PA is enabled and the other PAs are disabled. A multi-tone signal is transmitted and the SNDR of the enabled PA is measured. The bias for the enabled PA is tuned until the multi-tone SNDR reaches the target SNDR. The process is repeated for the other PAs.

Thus, a tunable bias may be adjusted for each PA $230_1$-$230_s$ such that a SNDR of each PA matches an average of the measured SNDRs of the PAs $230_1$-$230_s$.

After completing the initial calibration procedure, the observed combined signal $y_c(t)$ at the output of the combiner 250 may be used to determine the DPD coefficients $\vec{a}$. . More specifically, the DPD ADC 252 converts the combined signal $y_c(t)$ into the digital combined signal $y_c(n)$ to be used by the distortion estimator 255 to determine the pre-distortion compensation coefficients $\vec{a}$. .

As shown in FIG. 2A, the transceiver 200 includes the pre-equalizer 225 and, thus is compliant with Full Duplex DOCSIS 3.1 as set forth in DOCSIS 3.1 Physical Layer Specification Version 113 (published Dec. 20, 2017), the entire contents of which are hereby incorporated by reference. Having a tilt equalizer before a PA affects the effectiveness of DPD. As the pre-equalizer 225 shapes the signal that the PAs $230_1$-$230_s$ see, the pre-equalizer 225 affects the distortion generated by a conventional DPD model.

In at least some example embodiments, the DPD module 205 generates the pre-distortion compensated transmit signal $x_{DPD}(n)$ such that when the analog version of the pre-distortion compensated transmit signal $x_{DPD}(t)$ of the digital signal $x_{DPD}(n)$ passes through the pre-amplifier 220 and the pre-equalizer 225 and reaches the PAs $230_1$-$230_s$, the transmit signals for further transmission $x_{DPD\text{-}eq\text{-}1}(t)$-$x_{DPD\text{-}eq\text{-}s}(t)$ will be at values to reduce the effects caused by distortion.

Figure 2B:
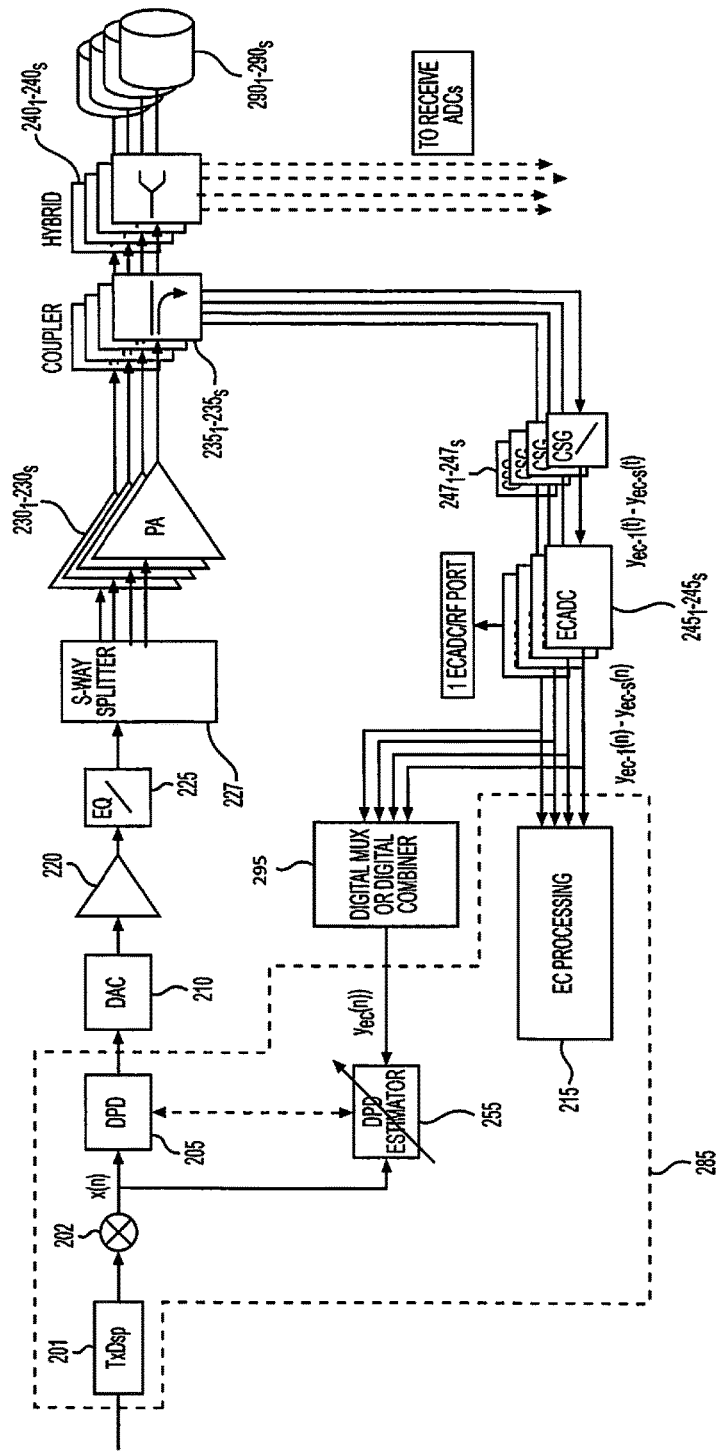
FIG. 2B illustrates a transceiver having digital pre-distortion compensation according to an example embodiment.

FIG. 2B illustrates a transceiver having digital pre-distortion compensation according to an example embodiment. A transceiver 200a, shown in FIG. 2B, is the same as the transceiver 200 except the transceiver 200a uses the ECADCs $245_1$-$245_s$ as the DPD ADC 252 and uses a digital combiner 295 instead of the analog combiner 250. Thus, only differences between the transceiver 200 and the transceiver 200a will be described. Using the ECADCs $245_1$-$245_s$ as the DPD ADC 252 eliminates the use of a separate DPD ADC.

In the transceiver 200 of FIG. 2A, the combined output signal $y_c(n)$ is the digitized version of $y_{c-1}(t)$+$y_{c-2}(t)$+ . . . $y_{c-s}(t)$. In the transceiver 200a of FIG. 2B, a combined output signal $y_{ec}(n)$ is a combination of signals $y_{ec-1}(n)$+$y_{ec-2}(n)$+ . . . $y_{ec-s}(n)$ output by the ECADCs $245_1$-$245_s$. As shown in FIG. 2B, the multiple ECADCs $245_1$-$245_s$ digitize the individual outputs of each PA $230_1$-$230_s$, respectively.

In FIG. 2B, the digital combiner 295 combines the outputs of the ECADCs $245_1$-$245_s$ and sums the digitized outputs from the PAs $230_1$-$230_s$. The combiner 295 outputs the combined output signal $y_{ec}(n)$ to the DPD estimator 255. In another example embodiment, a digital switch may be used instead of the digital combiner 295. When using a digital switch, the DPD estimator 255 may train on any individual PA $230_1$-$230_s$ and switch to another individual PA after a time period expires (e.g., predetermined) in a round robin fashion.

Figure 3:
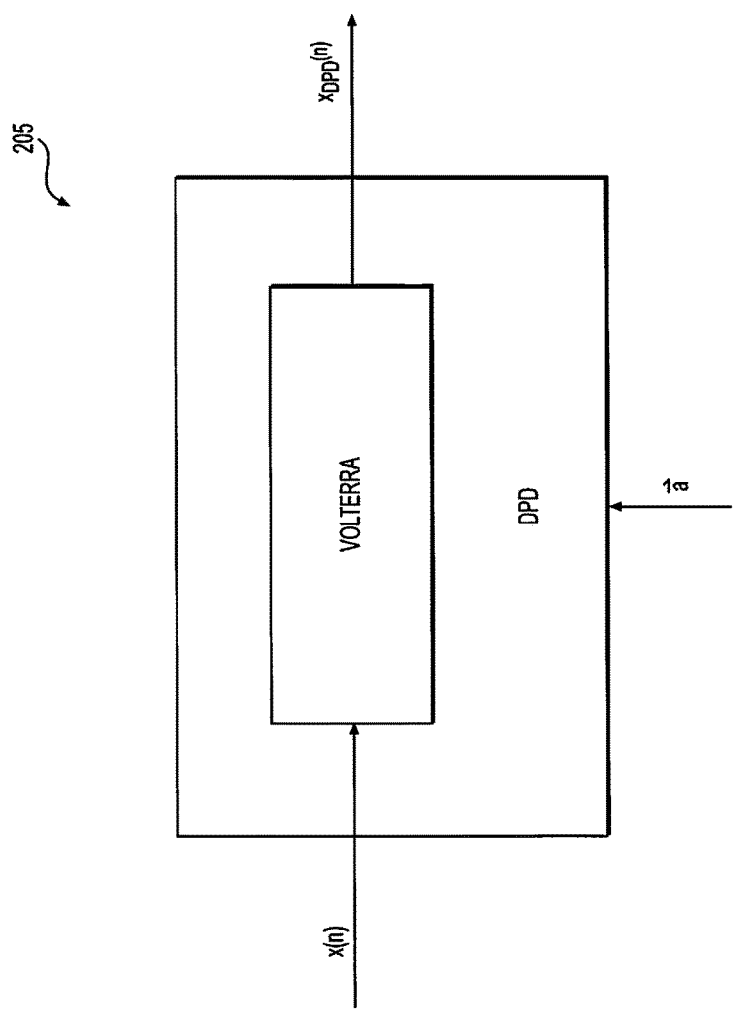

FIG. 3 illustrates an example embodiment of the DPD module 205. As shown in FIG. 3, the DPD module 205 implements a Volterra model that is used by the distortion estimator 255. The DPD module 205 generates Volterra model terms that are used in the DPD module 205 to generate the pre-distortion compensated transmit signal $x_{DPD}(n)$. Also, the Volterra model terms are used in the estimator 255 to estimate DPD coefficients $\vec{a}$. .

To determine the DPD coefficients $\vec{a}$. , the distortion estimator 255 determines an error $\varepsilon$ based on the digital transmit signal $x(n)$, observed digital combined signal $y_c(n)$ or $y_{ec}(n)$ and either a (linear) channel response $h(n)$ or on an equalizing channel response $h_{eq}(n)$ (i.e., the inverse of the channel response $h(n)$). The equalizing channel response $h_{eq}(n)$ can be an approximate channel inverse that is obtained using a ZF algorithm or a first order channel inversion.

The channel response $h(n)$ may be an impulse response of a monitor channel (shown in FIG. 4A as being the path from the DAC 210 to the ADC 252) if an analog combiner is put in front of the DPD ADC (as shown in FIG. 2A), or may be a combination of impulse responses of individual monitor channels (shown in FIG. 4B as being the paths from the DAC 210 to the respective ECADCs $245_1$-$245_s$) if the ECADCs $2451_1$-$245_s$ are used as a DPD ADC (e.g., as shown in FIG. 2B). The channel response $h(n)$ of the transceiver 200 (in FIG. 2A) is shown in FIG. 4A and the individual channel responses $h_1(n)$ to $h_s(n)$ of the transceiver 200a (in FIG. 2B) are shown in FIG. 4B.

Figure 4A:
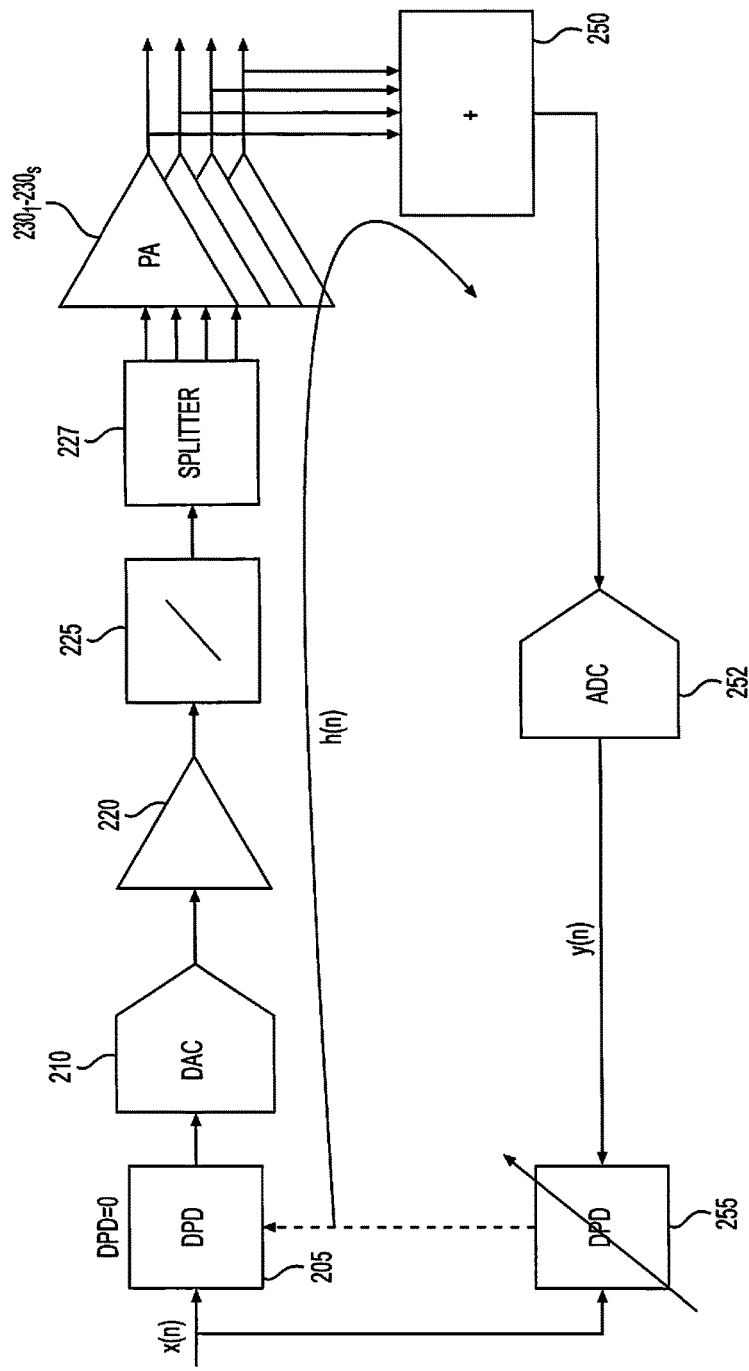
FIG. 4A illustrates a channel response of the transceiver illustrated in FIG. 2A.

In FIG. 4A, the channel response $h(n)$ can be determined during an initial calibration using a transmit signal transmitted at a lower power (e.g. 10 dB back off from regular operations) with all of the PAs $230_1$-$230_s$ enabled and measuring the observed analog combined signal $y_c(t)$ (i.e., the output of the combiner 250).

The observed analog combined signal $y_c(t)$ at the output of the combiner 250 is measured by the ADC 252 and the channel response $h(n)$ is calculated in the frequency domain $H(k)$ or time domain $h(n)$. Multiple measurements of the channel response $h(n)$ can be taken to improve accuracy of measurement. The channel response $H(k)=(Y_c(k))/(X(k))$ can be obtained by measuring the channel response from digital transmit signal $x(n)$ to the observed digital combined signal $y_c(n)$ in the frequency domain, using the DPD ADC 252.

Figure 4B:
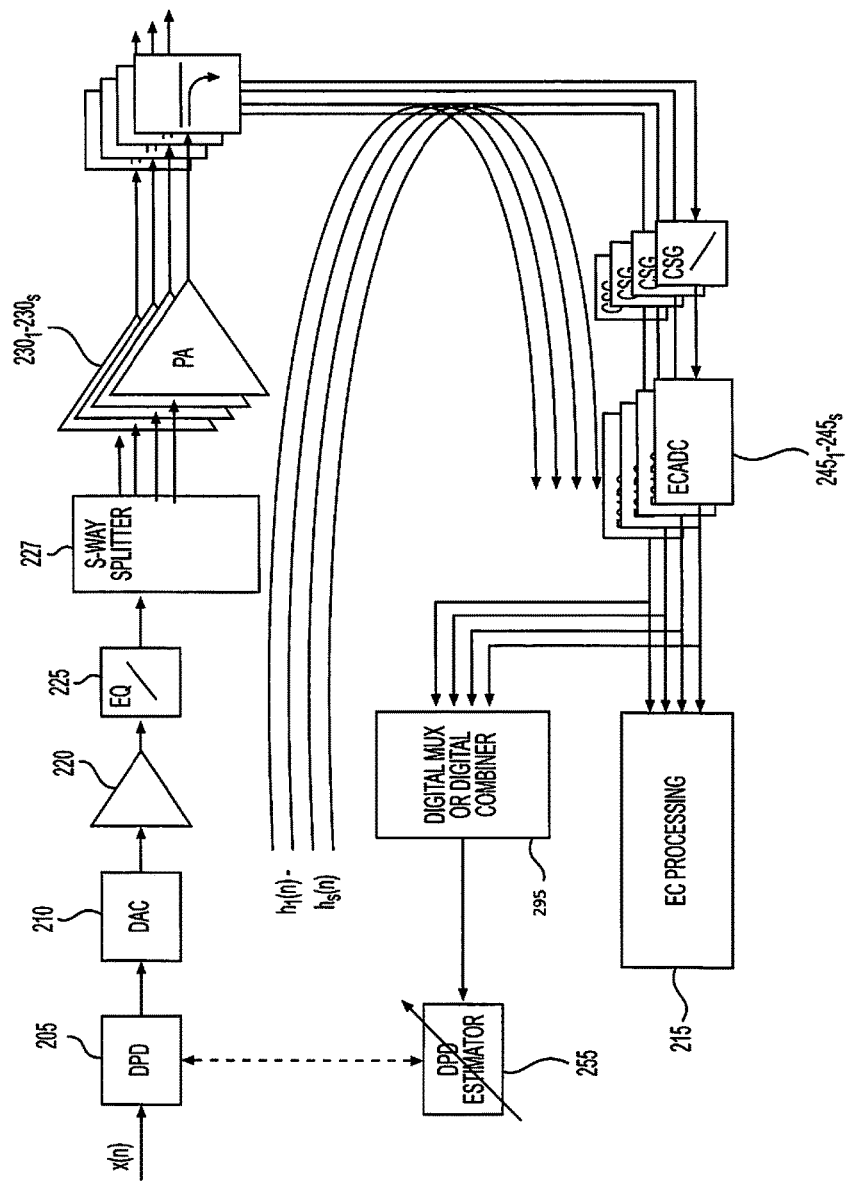
FIG. 4B illustrates a channel response of the transceiver illustrated in FIG. 2B.

Referring to FIG. 4B, when using an ECADC in an FDX DOCSIS system, the channel response h(n) may be available in the echo cancellation algorithm. Each ECADC $245_1$-$245_s$ performs an echo cancellation algorithm that determines a channel response in the frequency domain. For example, the ECADC $245_1$ determines the channel response $H_1(k)$ as:

$$H_1(k) = (Y_{ec\text{-}1}(k))/(X_1(k)) \tag{1}$$

where $Y_{ec\text{-}1}(k)$ is the output signal $y_{ec\text{-}1}(t)$ in the frequency domain.

The ECADCs $245_2$-$245_s$ determine the respective channel responses $H_2(k)$-$H_s(k)$ is the same manner. The combiner 295 may use the available ECADC channel responses $H_1(k)$-$H_s(k)$ to calculate a combined channel response as follows (using an example of four channel responses):

$$H(k) = H_1(k) + H_2(k) + H_3(k) + H_4(k); \text{ and} \tag{2}$$

$$h(n) = \text{IDFT}\{H(k)\} = h_1(n) + h_2(n) + h_3(n) + h_4(n). \tag{3}$$

The following describes how the DPD coefficients are determined by the processing system 285. The use of h(n) applies to both channel responses shown in FIGS. 4A-4B. The use of y(n) described below with respect to equations (4)-(16) refers both the observed digital combined signal $y_c(n)$ and the observed digital combined signal $y_{ec}(n)$. In other words, equations (4)-(16) apply to both the transceiver 200 and the transceiver 200a.

All DPD coefficients are initially set to zero.

In example embodiments where the distortion estimator 255 determines the error ε based on the channel response h(n), the distortion estimator 255 determines the error E as follows:

$$\varepsilon(n) = (y(n) - \tilde{x}(n)); \tag{4}$$

where $$\tilde{x}(n) = h(n) * x(n). \tag{5}$$

As shown above, the distortion estimator 255 generates a modified signal $\tilde{x}(n)$ by performing a convolution operation between the channel response h(n) and the digital transmit signal x(n). By generating the modified signal $\tilde{x}(n)$ using the channel response h(n), the tilt is not considered part of the error. As a result, the tilt has a reduced effect on the distortion estimation.

If the channel response h(n) is used in the frequency domain, then equation (2) becomes:

$$\tilde{x}(n) = \text{IDFT}\{H(k) \cdot X(k)\} \tag{6}$$

where H(k) is the channel response in the frequency domain and X(k) is the Discrete Fourier Transform (DFT) of the digital transmit signal x(n).

The DPD coefficients $\vec{a}$ are as follows:

$$\vec{a} = [a_1 \ldots a_{m_1}, \ldots, _{m_p}] \tag{7}$$

where the number of subscripts for a coefficient a represents a number of polynomial orders (i.e., 1 to P) and m represents the memory order per polynomial order (i.e., 1 to M).

The number of polynomial orders P and the memory order per polynomial order $M_p$ depends on the line driver and operation point. A more nonlinear line driver operating closer to the saturation point increases the polynomial order P of the DPD model used for correction. A line driver which has a long memory (such as those with harmonic tuning) increases the memory order $M_p$ of the DPD model used for correction.

The distortion estimator 255 can update the pre-distortion compensation coefficients $\vec{a}$ using a gradient descent or least mean square algorithm. The distortion estimator 255 may update the pre-distortion compensation coefficients $\vec{a}$ periodically (e.g., once every minute), dynamically or when a threshold condition is met.

Thus, the DPD coefficients $\vec{a}$ may be iteratively calculated by the distortion estimator 255 as follows:

$$a(t_1) = a(t_0) - \mu \cdot \Delta a \tag{8}$$

where μ is a step size and Δa is calculated by the distortion estimator 255 as follows:

$$\Delta a = (Z^H(n) \cdot Z(n))^{-1} Z^H(n) \cdot (\varepsilon(n)) \tag{9}$$

where $\vec{Z}$ is an estimation matrix of N samples:

$$Z = [\overline{\varphi(1)} \ldots \ldots \overline{\varphi(N)}] \tag{10}$$

and $\overline{\varphi(n)}$ is a vector of basis waveforms B.

In at least one example embodiment, the basis waveforms B are kernels of a truncated Volterra series and are a function of the digital transmit signal x(n):

$$\overline{\varphi(n)} = [B_1(x(n)) \ldots B_{M_1}(x(n)) \ldots B_{M_1, M_2}, \ldots M_p(x(n))]^T \tag{11}$$

To illustrate the use of subscripts, an example basis waveform is:

$$B_{-1,0,1}(x(n)) = x(n+1) \cdot x(n) \cdot x(n-1) \tag{12}$$

The DPD module 205 then determines the pre-distortion compensated transmit signal $x_{DPD}(n)$ as follows:

$$x_{DPD}(n) = \vec{a} \cdot \vec{Z} \tag{13}$$

In at least another example embodiment, the distortion estimator 255 determines the error E based on the equalized channel response $h_{eq}(n)$. In example embodiments where the distortion estimator 255 determines the error E based on the equalized channel response $h_{eq}(n)$, the distortion estimator 255 determines the error E as follows:

$$\varepsilon = (\tilde{y}(n) - x(n)) \tag{14}$$

$$\tilde{y}(n) = h_{eq}(n) * y(n) \tag{15}$$

where the distortion estimator 255 generates a modified signal $\tilde{y}(n)$ by performing a convolution operation between the equalized channel response $h_{eq}(n)$ and the digital combined observed digital combined signal y(n).

If performed in the frequency domain, equation (12) becomes:

$$\tilde{y}(n) = \text{IFFT}\{H_{eq}(k) \cdot Y(k)\} \tag{16}$$

where $H_{eq}(k)$ is the inverse channel response in the frequency domain and Y(k) is the FFT of the observed digital combined signal y(n).

By generating the modified signal $\tilde{y}(n)$ using the equalized channel response $h_{eq}(n)$, the tilt is not considered part of the error. As a result, the tilt has a reduced effect on the distortion estimation.

While some example embodiments have been described with respect to passband environments, some example embodiments may be implemented in baseband environments.

Conventionally, DPD was used for wireless applications in which a bandwidth is smaller than a carrier frequency. In these conventional systems, the intermodulation distortion falls on and around the transmit signal band. In DOCSIS systems, however, the signal bandwidth is larger than the carrier frequency, so both harmonic and intermodulation distortion falls on a usable transmit signal bandwidth.

To be implemented in baseband, including intermodulation and harmonic distortion, the DPD module 205 performs a conversion between passband and baseband as follows:

$$x(n) = \text{Real}\{\hat{x}(n) \cdot e^{j\omega_c n}\} \quad (17)$$

where x(n) is the passband first transmit signal, $\hat{x}(n)$ is a baseband first transmit signal and $\omega_c$ is the carrier frequency.

Thus, the passband digital transmit signal x(n) may be determined by the DPD module 205 as follows:

$$x(n) = \frac{\hat{x}(n) \cdot e^{j\omega_c n} + \hat{x}^*(n) \cdot e^{-j\omega_c n}}{2}. \quad (18)$$

A third order non-linearity (e.g. $x^3(n)$) can be written as:

$$x^3(n) = \hat{x}^3(n) \cdot e^{3j\omega_c n} + 3\hat{x}^2(n) \cdot \hat{x}^*(n) \cdot e^{j\omega_c n} + 3\hat{x}(n) \cdot \hat{x}^{*2}(n) \cdot e^{-j\omega_c n} + \hat{x}^{*3}(n) \cdot e^{-3j\omega_c n} \quad (19)$$

Down-conversion and low pass filtering (LPF) are used by the DPD module 205 to derive the baseband equivalent $\hat{x}(n)$ of the third order nonlinearity:

$$LPF\{x^3(n) \cdot e^{-j\omega_c n}\} = LPF\{\hat{x}^3(n) \cdot e^{2j\omega_c n} + 3\hat{x}^2(n) \cdot \hat{x}^*(n) + 3\hat{x}(n) \cdot \bar{x}^{*2}(n) \cdot e^{-2j\omega_c n} + \hat{x}^{*3}(n) \cdot e^{-j\omega_c n}\} \quad (20)$$

As shown above, $\hat{x}^3(n) \cdot e^{2j\omega_c n}$ is a harmonic term and $3\hat{x}^2(n) \cdot \hat{x}^*(n)$ is an intermodulation term. Only these two terms will remain after the LPF. Therefore:

$$LPF\{x^3(n) \cdot e^{-j\omega_c n}\} \approx \hat{x}^3(n) \cdot e^{2j\omega_c n} + 3\hat{x}^2(n) \cdot \hat{x}^*(n) \quad (21)$$

The baseband equivalent $\hat{x}(n)$ for general passband third order nonlinearities can be written as:

$$x(n-m_1) \cdot x(n-m_2) \cdot x(n-m_3) \Leftrightarrow e^{2j\omega(-m_1-m_2-m_3)} \cdot \hat{x}(n-m_1) \cdot \hat{x}(n-m_2) \cdot \hat{x}(n-m_3) e^{2j\omega n} + e^{2j\omega(m_1-m_2-m_3)} \cdot \hat{x}^*(n-m_1) \cdot \hat{x}(n-m_2) \cdot \hat{x}(n-m_3) + e^{2j\omega(-m_1+m_2-m_3)} \cdot \hat{x}(n-m_1) \cdot \hat{x}^*(n-m_2) \cdot \hat{x}(n-m_3) + e^{2j\omega(-m_1-m_2+m_3)} \cdot \hat{x}(n-m_1) \cdot \hat{x}(n-m_2) \cdot \hat{x}^*(n-m_3) \quad (22)$$

Using at least some example embodiments, some distortion compensation at unobservable high frequencies can be achieved. At least some example embodiments correct for unobservable distortion at high frequencies using information available at the low frequencies.

Figure 5:
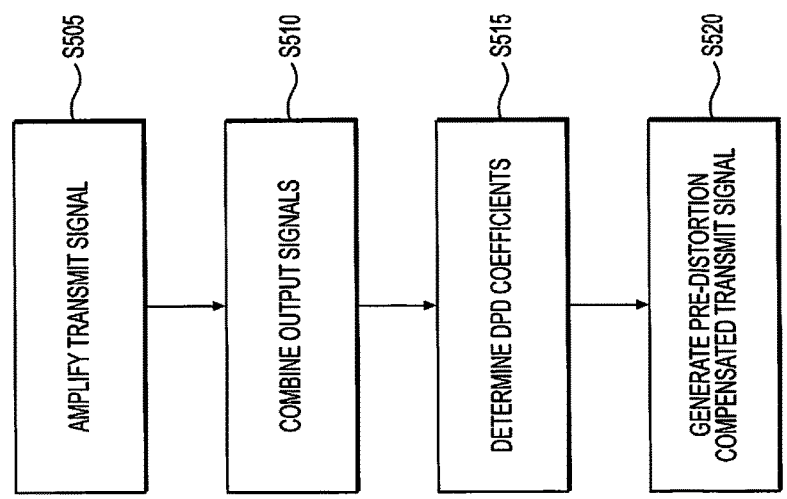

FIG. 5 illustrates a method of generating a pre-distortion compensated transmit signal according to an example embodiment.

The method of FIG. 5 may be performed by the transceiver 200, for example.

At S505, a plurality of amplifiers amplify an analog transmit signal to generate a plurality of amplified transmit signals for further transmission. For example, the plurality of PAs $230_1$-$230_s$ generate the plurality of amplified transmit signals for further transmission $y_1(t)$-$y_s(t)$.

At S510, a plurality of output signals are combined to generate a combined signal. The plurality of output signals are based on the plurality of amplified transmit signals. For example, the combiner 250 combines the output signals $y_{c-1}(t)$-$y_{c-s}(t)$ to generate an observed analog combined signal $y_c(t)$.

At S515, at least one processor causes the transceiver to determine pre-distortion compensation coefficients based on the combined signal. For example, the processing system 285 determines the DPD coefficients $\vec{a}$ based on the observed digital combined signal $y_c(n)$.

At S520, the at least one processor causes the transceiver to generate a pre-distortion compensated transmit signal based on the pre-distortion compensation coefficients. For example, the processing system 285 generates the pre-distortion compensated transmit signal $x_{DPD}(n)$ using the DPD coefficients $\vec{a}$.

Figure 6:
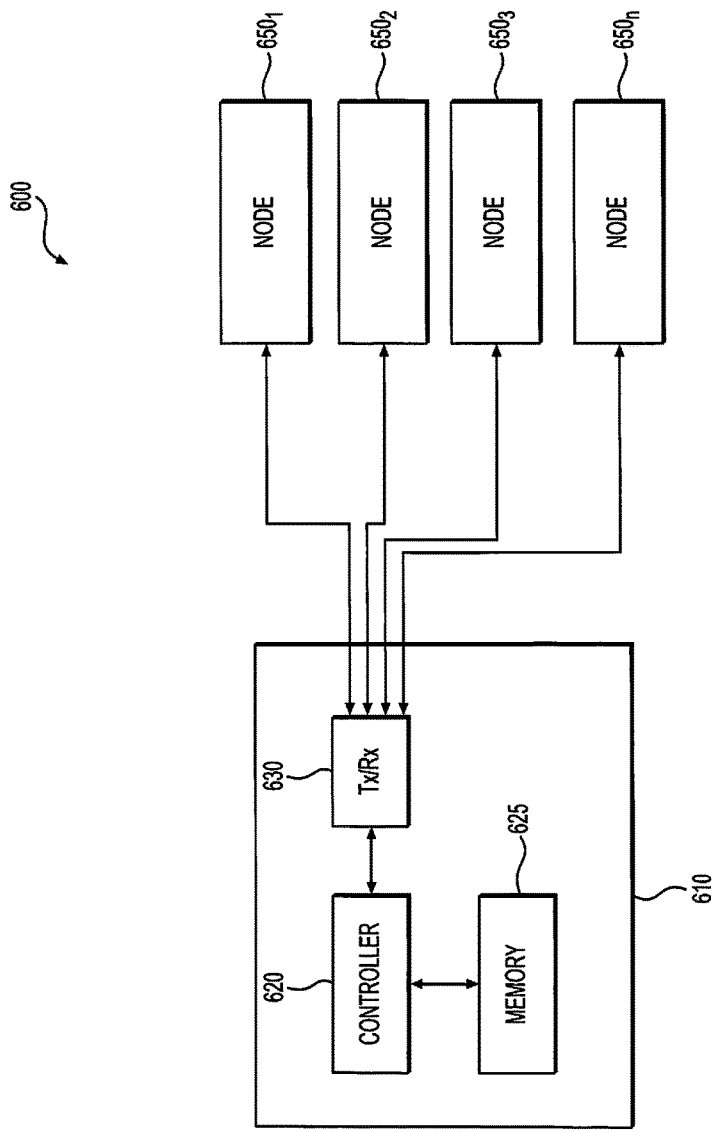

FIG. 6 illustrates a communication system according to an example embodiment.

As shown in FIG. 6, a system 600 includes a node 610 configured to communicate with nodes (e.g., modems) $650_1$-$650_n$ using wired or wireless wired technologies.

The node 610 includes a transceiver 630 and a controller 620. The controller 620 is configured to perform the algorithms described above with reference to FIGS. 2-5. For example, the controller 620 may be the processing system 285. In an example embodiment, the controller 620 is at least one processor that performs the algorithms described with reference to FIGS. 2-5 by executing computer readable instructions stored in the memory 625.

To operate a PA at a reduced bias setting, which lowers power consumption, the PA incurs significant nonlinear distortion at its output. Example embodiments provide DPD that enable linear operation for multiple PAs in the system. As described, a transceiver according to at least some example embodiments includes only one DPD module, one estimator and one ADC for multiple PAs in the system, which significantly reduces the total power consumption and cost.

Moreover, at least some example embodiments disclose a baseband equivalent DPD model incorporating harmonic and intermodulation terms to enable baseband correction of both harmonic and intermodulation distortion in systems.

Example embodiments being thus described, it will be obvious that the same may be varied in many ways. Such variations are not to be regarded as a departure from the spirit and scope of example embodiments, and all such modifications as would be obvious to one skilled in the art are intended to be included within the scope of the claims.

The invention claimed is:

1. A transceiver having a plurality of output transmission paths, the transceiver comprising:
   a plurality of amplifiers configured to amplify an analog transmit signal to generate a plurality of amplified transmit signals for further transmission;
   a combiner configured to combine a plurality of output signals for the plurality of output transmission paths to generate a combined signal, the plurality of output signals being based on the plurality of amplified transmit signals;
   an analog-to-digital converter (ADC) configured to convert the combined signal to a digital combined signal; and
   at least one processor configured to execute computer-readable instructions to cause the transceiver to,
      determine an error based on the digital combined signal and a reference signal,
      determine pre-distortion compensation coefficients based on the error, and
      generate a pre-distortion compensated transmit signal based on the pre-distortion compensation coefficients, wherein the reference signal is a digital transmit signal, the analog transmit signal is based on the digital transmit signal and the at least one processor is configured to execute the computer-readable instructions to cause the transceiver to determine the error as being a difference between the digital combined signal and a convolution of the reference signal with a channel response within the transceiver.

2. The transceiver of claim 1, wherein the at least one processor is configured to execute the computer-readable instructions to cause the transceiver to determine the channel response within the transceiver.

3. The transceiver of claim 1, wherein the channel response is a response of a monitor channel including at least one of the plurality of amplifiers and the combiner.

4. The transceiver of claim 3, wherein the monitor channel further includes an pre-equalization filter.

5. The transceiver of claim 1, wherein the at least one processor is configured to execute the computer-readable instructions to cause the transceiver to determine an average signal-to-noise and distortion ratio (SNDR) for each of the plurality of amplifiers using a multi-tone signal and adjust a bias of each of the plurality of amplifiers based on the average SNDRs.

6. The transceiver of claim 1, wherein the at least one processor is configured to execute the computer-readable instructions to cause the transceiver to iteratively update the pre-distortion compensation coefficients using a least mean squares algorithm.

7. The transceiver of claim 1, wherein the transceiver is a full-duplex transceiver.

8. The transceiver of claim 1, wherein the at least one processor is configured to execute the computer-readable instructions to cause the transceiver to determine the pre-distortion compensation coefficients to pre-compensate for inter-modulation distortions and harmonic distortions caused by the plurality of amplifiers using a complex baseband digital pre-distortion (DPD) method.

9. A transceiver having a plurality of output transmission paths, the transceiver comprising:
a plurality of amplifiers configured to amplify an analog transmit signal to generate a plurality of amplified transmit signals for further transmission;
a combiner configured to combine a plurality of output signals for the plurality of output transmission paths to generate a combined signal, the plurality of output signals being based on the plurality of amplified transmit signals;
an analog-to-digital converter (ADC) configured to convert the combined signal to a digital combined signal; and
at least one processor configured to execute computer-readable instructions to cause the transceiver to,
determine an error based on the digital combined signal and a reference signal,
determine pre-distortion compensation coefficients based on the error, and
generate a pre-distortion compensated transmit signal based on the pre-distortion compensation coefficients, wherein the reference signal is a digital transmit signal, the analog transmit signal is based on the digital transmit signal and the at least one processor is configured to execute the computer-readable instructions to cause the transceiver to determine the error as being a difference between the reference signal and a convolution of the digital combined signal with an inverse of a channel response within the transceiver.

10. A method for compensating for digital distortion, the method comprising:
amplifying an analog transmit signal to generate a plurality of amplified transmit signals for further transmission;
combining a plurality of output signals for a plurality of output transmission paths to generate a combined signal, the plurality of output signals being based on the plurality of amplified transmit signals, the plurality of output signals being analog output signals and the combined signal is an analog signal;
converting the combined signal to a digital combined signal;
determining an error based on the digital combined signal and a reference signal;
determining pre-distortion compensation coefficients based on the error; and
generating a subsequent pre-distortion compensated transmit signal based on the pre-distortion compensation coefficients, wherein the reference signal is a digital transmit signal, the analog transmit signal is based on the digital transmit signal and the determining the error determines the error as being a difference between the digital combined signal and a convolution of the reference signal with a channel response within a transceiver.

11. The method of claim 10, further comprising:
determining the channel response within the transceiver.

12. The method of claim 10, wherein the channel response is a response of a monitor channel including at least one power amplifier and a combiner.

13. The method of claim 12, wherein the monitor channel further includes a pre-equalization filter.

14. The method of claim 10, further comprising:
determining an average signal-to-noise and distortion ratio (SNDR) for each of a plurality of amplifiers using a multi-tone signal; and
adjusting a bias of each of the plurality of amplifiers based on the average SNDRs.

15. The method of claim 10, further comprising:
iteratively updating the pre-distortion compensation coefficients using a least mean squares algorithm.

16. The method of claim 10, wherein the determining the pre-distortion compensation coefficients determines the pre-distortion compensation coefficients to pre-compensate for inter-modulation distortions and harmonic distortions caused by a plurality of amplifiers using a complex baseband digital pre-distortion (DPD) method.

17. A method for compensating for digital distortion, the method comprising:
amplifying an analog transmit signal to generate a plurality of amplified transmit signals for further transmission;
combining a plurality of output signals for a plurality of output transmission paths to generate a combined signal, the plurality of output signals being based on the plurality of amplified transmit signals, the plurality of output signals being analog output signals and the combined signal is an analog signal;
converting the combined signal to a digital combined signal;
determining an error based on the digital combined signal and a reference signal;
determining pre-distortion compensation coefficients based on the error; and generating a subsequent pre-distortion compensated transmit signal based on the pre-distortion compensation coefficients, wherein the reference signal is a digital transmit signal, the analog transmit signal is based on the digital transmit signal and the determining the error determines the error as being a difference between the reference signal and a convolution of the digital combined signal with an inverse of a channel response within a transceiver.

\* \* \* \* \*